July 29, 1969 R. P. DOLAN, JR., ET AL 3,457,632

PROCESS FOR IMPLANTING BURIED LAYERS IN SEMICONDUCTOR DEVICES

Filed Oct. 7, 1966

INVENTORS.
RUSSELL P. DOLAN JR.,
SVEN A. ROOSILD
BY Harry A. Herbert Jr
ATTORNEY
Henry S. Miller Jr
AGENT

United States Patent Office 3,457,632
Patented July 29, 1969

3,457,632

PROCESS FOR IMPLANTING BURIED LAYERS IN SEMICONDUCTOR DEVICES

Russell P. Dolan, Jr., Concord, and Sven A. Roosild, Billerica, Mass., assignors to the United States of America as represented by the Secretary of the Air Force Filed Oct. 7, 1966, Ser. No. 586,002
Int. Cl. B01j 17/00; H01l 5/00
U.S. Cl. 29—578 1 Claim

ABSTRACT OF THE DISCLOSURE

A method of forming semiconductor electronic devices by ionic bombardment including the steps of placing an ion absorbing mask of semiconductor substrate; bombarding the substrate with monoenergetic ions and heating the material to repair radiation damage.

Figures 1, 2:
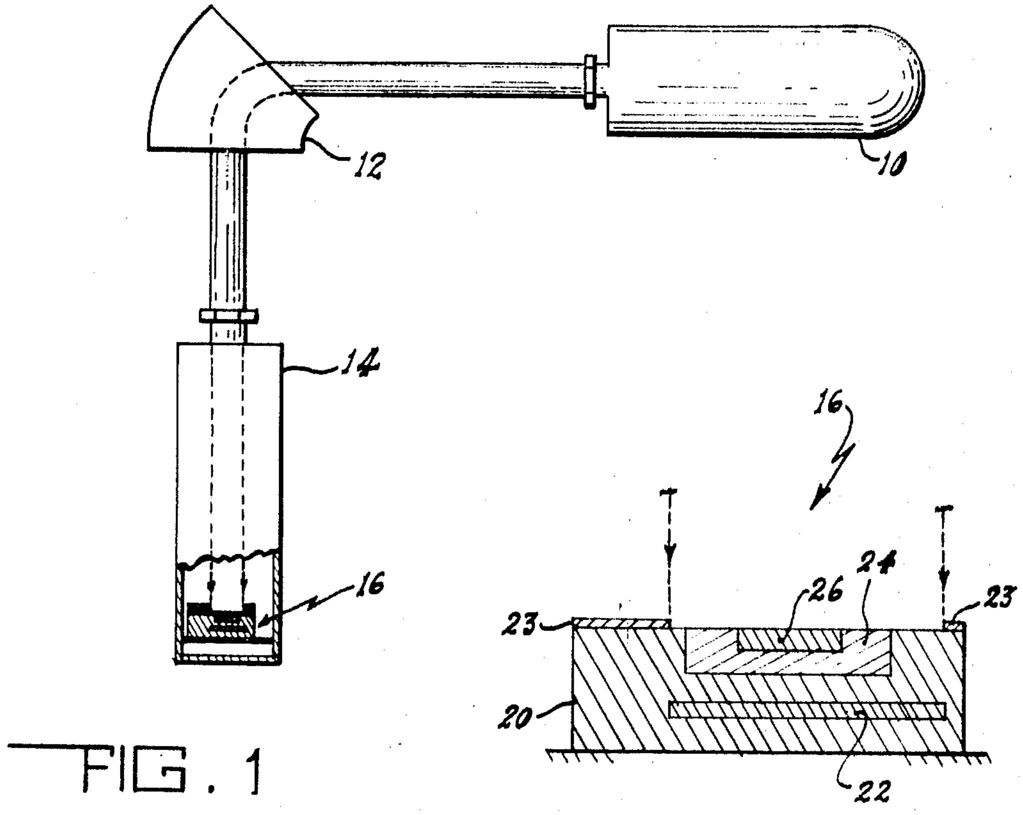

The invention described herein may be manufactured and used by or for the United States Government for governmental purposes without payment to us of any royalty thereon.

This invention relates generally to a process used in the fabrication of semiconductor devices, and more particularly to a process for implanting high energy ions as a buried layer in semiconductor devices.

In the past when a high conductance layer was to be formed below the collector junction of a bipolar transistor or in the drain region of a vertical channel field effect transistor, it was sandwiched between the substrate and the collector in one of two alternative methods. The first method is by diffusing the low resistivity layer into the substrate before the epitaxial growth of the higher resistivity collector; the second method involves selective growth of the heavily doped regions using masked epitaxial techniques, and then continuing by growing the collector region epitaxially.

In our new and novel process a buried layer of active impurities of the same productivity type is implanted in a substrate material. From our process there is produced a semiconductor device having an accurately located shunt which avoids high collector resistance, for example, in a bipolar transistor.

The process of this invention is particularly adaptable to the manufacture of integrated circuits wherein it is difficult to use buried layers, in that they tend to diffuse as the material is heated during subsequent steps of fabrication. Further, this process provides a buried layer which is so accurately located the probability of short-circuiting between elements of integrated circuit is nil.

With this process it is possible to provide a higher performance device than ever before possible with the planar diffusion process. Likewise this process provides a means for implanting semiconductors with atoms which do not easily diffuse.

It is therefore an object of this invention to provide a new and improved process for implanting a buried layer in semiconductor devices.

It is a further object of this invention to provide an improved method for fabricating semiconductor devices without the use of the epitaxial process.

It is another object of this invention to provide a new and improved method of implanting semiconductors with atoms which do not easily diffuse.

It is still a further object of this invention to provide a process for fabricating semiconductor devices with accurately located buried layers.

These and other advantages, features and objects of the invention will become more apparent from the following description taken in connection with the illustrative embodiments in the accompanying drawings, wherein:

FIGURE 1 is a side elevational view, partly in section of the apparatus utilized in this invention; and FIGURE 2 is a cross sectional view of a semiconductor devices produced by this invention.

To better explain the process of this invention, reference is now made to FIGURE 1 wherein 10 represents an ion generator such as the Van de Graaff or Cockroft-Walton type known to those in the art. A mass spectrometer 12 separates the ions assuring that only monoenergetic ions of the selected species reach the vacuum chamber 14. The semiconductor material 16 is partially covered with ion absorbing material and is mounted in the vacuum tank 14 where it is bombarded with ions which penetrate the exposed portions of the semiconductor material and forms a buried layer therein.

Concerning FIGURE 2, a quantity of substrate material which may be either the p- or n-type has mounted thereon an ion absorbing layer 23. This is then bombarded with monoenergetic ions in the apparatus shown in FIGURE 1. The layer 22 thus formed is of the same conductivity type as the surrounding material 20. However, it is heavily doped and acts as a shunt through the material 20. After bombardment the device is heated to repair any radiation damage caused to the semiconductor material. Temperatures in the range of 300° to 500° C. are adequate to remove radiation damage when silicon is utilized, but a slightly higher temperature is required to supply the activation energy necessary to place the majority of the implanted ions in lattice sites so they are electively conductive. The base 24 and emitter 26 are placed in the device by conventional methods. With this process it is possible to implant buried layers of materials which do not readily diffuse such as nitrogen. Further, by using the ion absorbing layer of an oxide or similar material, it is possible to control the area of the buried layer. The duration of the bombardment will determine the concentration of the buried layer and hence its resistance while the depth of the layer is controlled by the energy of the ions.

Although the invention has been described with reference to a particular embodiment, it will be understood to those skilled in the art that the invention is capable of a variety of alternative embodiments within the spirit and scope of the appended claim.

We claim:

1. A method of fabricating semiconductive devices by ion implantation comprising the steps of: selectively applying an ion absorbing mask to a body of semiconductive material; bombarding the composite with monoenergetic ions of the same type as the said semiconductive material whereby a buried concentrated layer is formed; heating the semiconductive material to repair radiation damage; and removing the said mask and applying the base and emitter to the semiconductor material.

References Cited

UNITED STATES PATENTS

| | | | |
|---|---|---|---|
| 2,735,948 | 2/1956 | Sziklai | 29—577 X |
| 2,787,564 | 4/1957 | Shockley. | |
| 2,750,541 | 6/1956 | Ohl | 29—572 X |
| 3,293,084 | 12/1966 | McCaldin | 148—1 |

JOHN F. CAMPBELL, Primary Examiner

U.S. Cl. X.R.

148—1.5